United States Patent
Zou et al.

(10) Patent No.: US 8,509,629 B2
(45) Date of Patent: Aug. 13, 2013

(54) HIGH SENSITIVITY TWO-STAGE AMPLIFIER

(75) Inventors: Hehong Zou, Westlake Village, CA (US); Krishna Shivaram, Torrance, CA (US); Daniel Draper, Portland, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 686 days.

(21) Appl. No.: 12/288,982

(22) Filed: Oct. 24, 2008

(65) Prior Publication Data

US 2009/0110409 A1 Apr. 30, 2009

Related U.S. Application Data

(60) Provisional application No. 61/000,524, filed on Oct. 26, 2007.

(51) Int. Cl.
*H04B 10/06* (2006.01)
*H03F 1/34* (2006.01)
*H03F 3/68* (2006.01)

(52) U.S. Cl.
USPC ........... 398/208; 398/202; 398/210; 330/293; 330/277; 330/69; 330/289

(58) Field of Classification Search
USPC .................................. 398/202, 208
See application file for complete search history.

(56) References Cited

U.S. PATENT DOCUMENTS

| | | | |
|---|---|---|---|
| 4,534,064 A | 8/1985 | Giacometti et al. | |
| 4,864,649 A | 9/1989 | Tajima et al. | |
| 5,019,769 A | 5/1991 | Levinson | |
| 5,293,405 A | 3/1994 | Gersbach et al. | |
| 5,383,046 A | 1/1995 | Tomofuji et al. | |
| 5,383,208 A | 1/1995 | Queniat et al. | |
| 5,394,416 A | 2/1995 | Ries | |
| 5,396,059 A | 3/1995 | Yeates | |
| 5,471,501 A | 11/1995 | Parr et al. | |
| 5,491,548 A | 2/1996 | Bell et al. | |
| 5,594,748 A | 1/1997 | Jabr | |
| 5,710,660 A | 1/1998 | Yamamoto et al. | |
| 5,812,572 A | 9/1998 | King et al. | |
| 5,844,928 A | 12/1998 | Shastri et al. | |
| 5,892,220 A | 4/1999 | Woodward | |

(Continued)

FOREIGN PATENT DOCUMENTS

| EP | 00606161 | 4/2000 |
|---|---|---|
| JP | 2001-119250 | 4/2001 |

OTHER PUBLICATIONS

Kim ["Dual Output Transimpedance Amplifier of Cost Effective CMOS Optical Receiver for Digital Audio Interfaces" Circuits and Systems, 2007. ISCAS 2007. IEEE International Symposium].*

(Continued)

*Primary Examiner* — Shi K Li
*Assistant Examiner* — Oommen Jacob
(74) *Attorney, Agent, or Firm* — Weide & Miller, Ltd.

(57) ABSTRACT

The invention relates to amplifiers and in particular, to a transimpedance amplifier for high rate applications. Disclosed is a two stage transimpedance amplifier having a first stage comprising an amplifier and a load and a second stage comprising an amplifier and a resistor. Negative feedback is provided through a feedback resistor. Only two voltage conversions occur which reduces phase distortion, as compared to three stage transimpedance amplifiers which perform 3 voltage conversions.

12 Claims, 3 Drawing Sheets

(56) References Cited

U.S. PATENT DOCUMENTS

| | | | |
|---|---|---|---|
| 5,900,959 A | 5/1999 | Noda et al. | |
| 5,956,168 A | 9/1999 | Levinson et al. | |
| 6,005,240 A | 12/1999 | Krishnamoorthy | |
| 6,081,362 A | 6/2000 | Hatakeyama et al. | |
| 6,108,113 A | 8/2000 | Fee | |
| 6,111,687 A | 8/2000 | Tammela | |
| 6,282,017 B1 | 8/2001 | Kinoshita | |
| 6,366,373 B1 | 4/2002 | MacKinnon et al. | |
| 6,397,090 B1 | 5/2002 | Cho | |
| 6,452,719 B2 | 9/2002 | Kinoshita | |
| 6,494,370 B1 | 12/2002 | Sanchez | |
| 6,556,601 B2 | 4/2003 | Nagata | |
| 6,657,488 B1 | 12/2003 | King et al. | |
| 6,661,940 B2 | 12/2003 | Kim | |
| 6,707,600 B1 | 3/2004 | Dijaili et al. | |
| 6,720,826 B2 * | 4/2004 | Yoon | 330/69 |
| 6,740,864 B1 | 5/2004 | Dries | |
| 6,801,555 B1 | 10/2004 | Dijaili et al. | |
| 6,828,857 B2 | 12/2004 | Paillet et al. | |
| 6,837,625 B2 | 1/2005 | Schott et al. | |
| 6,852,966 B1 | 2/2005 | Douma et al. | |
| 6,868,104 B2 | 3/2005 | Stewart et al. | |
| 6,888,123 B2 | 5/2005 | Douma et al. | |
| 6,909,731 B2 | 6/2005 | Lu | |
| 6,934,479 B2 | 8/2005 | Sakamoto et al. | |
| 6,941,077 B2 | 9/2005 | Aronson et al. | |
| 6,952,531 B2 | 10/2005 | Aronson et al. | |
| 6,956,643 B2 | 10/2005 | Farr et al. | |
| 6,957,021 B2 | 10/2005 | Aronson et al. | |
| 6,967,320 B2 | 11/2005 | Chieng et al. | |
| 7,031,574 B2 | 4/2006 | Huang et al. | |
| 7,039,082 B2 | 5/2006 | Stewart et al. | |
| 7,049,759 B2 | 5/2006 | Roach | |
| 7,050,720 B2 | 5/2006 | Aronson et al. | |
| 7,058,310 B2 | 6/2006 | Aronson et al. | |
| 7,066,746 B1 | 6/2006 | Togami et al. | |
| 7,079,775 B2 | 7/2006 | Aronson et al. | |
| 7,127,391 B2 | 10/2006 | Chang et al. | |
| 7,184,671 B2 | 2/2007 | Wang | |
| 7,193,957 B2 | 3/2007 | Masui et al. | |
| 7,215,891 B1 | 5/2007 | Chiang et al. | |
| 7,381,935 B2 | 6/2008 | Sada et al. | |
| 2001/0046243 A1 | 11/2001 | Schie | |
| 2002/0105982 A1 | 8/2002 | Chin et al. | |
| 2003/0067662 A1 | 4/2003 | Brewer et al. | |
| 2003/0122057 A1 | 7/2003 | Han et al. | |
| 2004/0047635 A1 | 3/2004 | Aronson et al. | |
| 2004/0095976 A1 | 5/2004 | Bowler et al. | |
| 2004/0136727 A1 | 7/2004 | Androni et al. | |
| 2004/0202215 A1 | 10/2004 | Fairgrieve | |
| 2004/0240041 A1 | 12/2004 | Tian et al. | |
| 2005/0062530 A1 | 3/2005 | Bardsley et al. | |
| 2005/0168319 A1 * | 8/2005 | Bhattacharya et al. | 338/309 |
| 2005/0180280 A1 | 8/2005 | Hoshino et al. | |
| 2005/0215090 A1 | 9/2005 | Harwood | |
| 2006/0278813 A1 | 12/2006 | Iesaka | |

OTHER PUBLICATIONS

Analog Devices, Background information about wireless communications. Date unknown. http://rf.rfglobalnet.com/library/applicationnotes/files/7/bginfo.htm.

P.M. Crespo Bofil, G. Shing Liu, C. Ho Wei. Combine baud-rate timing recovery and adaptive equalization for high rate data transmission in digital subscriber lines. In Comunicaciones de Telefonica y Desarrollo, vol. 41, No. 7, Jun. 1993. http://www.tid.es/presencia/publicaciones/comsid/esp/articulos/vol41/combi/combi.html.

Abhijit Phanse, National Semiconductor, "Exercise 2: Define the time variance of a fiber optic channel's Impulse Response, and suggest a method for measuring it", IEEE 802.3ae, 11/00, 13 pages.

"PLL Design", http://members.innet.net.au/~richard/PPH.htm, 9 pages.

Garth Nash, "AN535 Application Notes—Phase-Locked Loop Design Fundamentals", Motorola, Inc., 1994, 3 pages.

Ron Bertrand, "The Basics of PLL Frequency Synthesis", Online Radio & Electronics Course, Apr. 2002, 9 pages.

Jaime Bailey "How DVD Works", http://sweb.uky.edu/~jrbail01/dvd.htm, May 1999, 6 pages.

Tuan "Solace" Nguyen, "CD, CD-R, CD-RW, DVD, DVE-RAM, DVD-RW, and MO", Tweak3D.Net—Your Freakin' Tweakin" Source!, http://www.tweak3d.net/articles/opticals/, May 13, 2000, 7 pages.

Richard Wilkinson, "topic: Selecting the Right DVD Mastering Technique", DVD Technology Update, http://www.optical-disc.com/dvdupdate.html, 2002, 8 pages.

Dr. John. Rilum, "Mastering Beyond DVD Density", http://www.optical-disc.com/beyonddvd.html. 2002, 7 pages.

"CD Basics: The Bumps", Howstuffworks "how CD Burners Work", http://entertainment.howstuffworks.com/cd-burner1.htm, 2004, 3 pages.

"An Introduction to DVD Recordable (DVD-R) What is DVD Recordable?" http://www.dvd-copy.com/reference/dvd_recordable.html, 2004, 8 pages.

"An Introduction to DVD-RW", DVD White Paper, Pioneer New Media Technologies, Inc., Feb. 8, 2001, 8 pages.

* cited by examiner

HIGH SENSITIVITY TWO-STAGE AMPLIFIER

1. PRIORITY CLAIM

This application claims priority to and the benefit of U.S. Provisional Application No. 61/000,524 entitled HIGH SENSITIVITY TWO-STAGE CMOS TRANSIMPEDANCE AMPLIFIER FOR 1-4 GBPS APPLICATIONS which was filed on Oct. 26, 2007.

2. FIELD OF THE INVENTION

The invention relates to amplifiers and in particular, to a transimpedance amplifier for high rate applications.

3. RELATED ART

The designers of data communication systems continually strive to increase a communication system's data transmit rate, effective transmit distance, and accuracy of operation. One aspect that controls the communication systems data transmit distance is the sensitivity of the receiver. While particularly important in the optical signal communication, these principles also apply for wire line applications.

As transmitted signals advance through a channel, such signals become attenuated. In addition, at higher rates, the received signals may be more affected by crosstalk and dispersion. As a result, increased sensitivity in the receiver improves detection and decoding of received signals, particularly when the received signal is a high rate, attenuated signal.

One existing device used to detect attenuated received signals is an Avalanche Photo Diode (APD). However, APDs are undesirably expensive. For example, the APD may cost up to ten times the cost of the PIN (positive-intrinsic-negative) photodiode, plus there is additional cost for the circuitry to provide and control the APD reverse-bias voltage.

Other solutions have been proposed, but these proposed solutions do not meet the design specifications, such as noise limits. For example, people have used a three-stage CMOS inverter approach, but this approach has limited sensitivity. The same applies to designs implementing a one-stage CMOS inverter approach.

SUMMARY

To overcome the drawbacks of the prior art and to provide additional benefits, disclosed herein is an optical signal receiver. In one example embodiment, the receiver includes a two stage transimpedance amplifier having reduced phase shift, delay, and distortion while maintaining or exceeding gain specification. In one embodiment, the optical signal detector is configured to detect an optical signal and output a corresponding electrical signal. The electrical signal is output to a two stage transimpedance amplifier configured to receive and amplify the electrical signal to a level suitable for down stream processing. In this embodiment, the two stage transimpedance amplifier comprises a first stage having an amplifier and a load and a second stage having an amplifier and a resistor. Also part of this embodiment is a feedback path including a feedback resistor. In this embodiment, the feedback path connects an output of the second stage to an input of the first stage. One or more receiver processing elements may be located down stream and configured to process the amplified electrical signal received from the two stage transimpedance amplifier. One of the stages is inverting to create negative feedback as compared to the input signal. In this embodiment, only two voltage conversions occur. A voltage conversion is defined herein as amplification of a voltage signal with or without an inversion. The amplifier stages may be inverting or non-inverting.

In one embodiment, the receiver further comprises a single ended to differential signal conversion unit configured to receive the output of the second stage and convert the output to a differential signal. In one embodiment, the load comprises a FET. It is contemplated that the first stage may comprise a voltage to voltage amplifier and the second stage may comprise a voltage to voltage amplifier. It is also contemplated that the resistor of the second stage may comprise a semiconductor device. The first stage and the second stage may collectively perform two voltage conversions, which in turn introduce less phase shift as compared to a three stage transimpedance amplifier performing three voltage conversions. In one embodiment, the feedback path provides negative feedback to the input of the first stage.

Also disclosed herein is the transimpedance amplifier which in one embodiment may comprise an input node configured to receive a signal. Also part of the amplifier is a first stage having an input connected to the input node and a first stage output. A second stage is also present and has an input which connects to the output of the first stage, and a second stage output. An output node connects to the second stage output. A feedback path having a resistance connects the input node to the output node. In this example embodiment, only one of the stages is inverting.

In one embodiment, the first stage comprises an amplifier and a load. In one embodiment the second stage comprises an amplifier and a resistor. In this embodiment the feedback path provides negative feedback to the input node. It is contemplated that the first stage and the second stage, when processing a signal, are configured to perform no more than two voltage conversions. In one embodiment, only two voltage conversions occur.

Also disclosed herein is a method for receiving and amplifying a receiving optical signal comprising receiving an optical signal and converting the optical signal to an electrical signal. Then, presenting the electrical signal to an input node and combining the electrical signal with a feedbacks signal to create a combined signal. This method then amplifies the combined signal with a first stage. In this embodiment, the first stage performs a voltage conversion on the combined signal to create a first amplified signal. The method then amplifies the first amplified signal with a second stage. In this embodiment the second stage performs a voltage conversion on the first amplified signal to create a second amplified signal. The operation then outputs the second amplified signal on an output node and attenuates the second amplified signal to create the feedback signal. In this embodiment, only 1 stage performs a phase inversion. Alternatively additional phase inversion could occur to establish negative feedback.

In one embodiment, the first stage comprises an amplifier and a load. In one embodiment, the second stage comprises an amplifier and a resistor. As a benefit to this method over the prior art, the two voltage conversions create less phase distortion than three voltage conversions.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
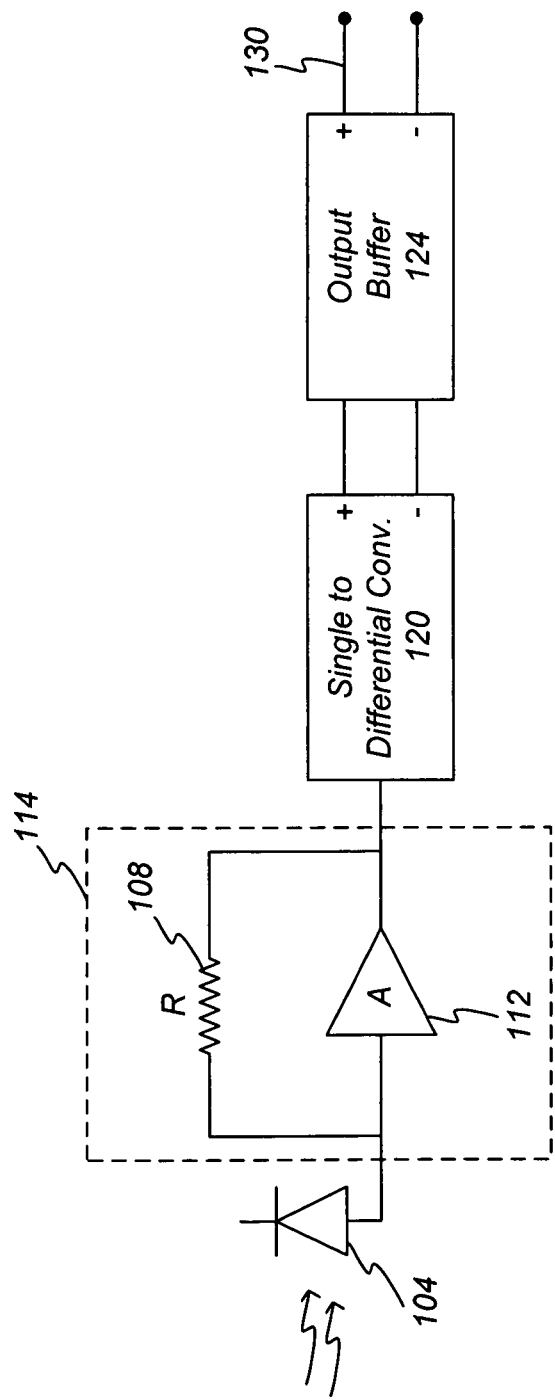
FIG. 1 illustrates an example environment of use of the present invention.

FIG. 1 illustrates an example environment of use of the invention. This is but one possible example environment of use and as such, it is contemplated that the invention may also be enabled in other environments. As shown, an amplifier (A) 112 as disclosed herein is utilized in an optical communication system. As is generally understood the amplifier 112 and a resistor 108 may comprise a TIA 114 which serves as a highly sensitive amplifier to receive and amplify weak signals in a highly accurate and noise minimized manner.

In this example environment, an optical signal is presented to a photo diode 104. In this embodiment the optical signal travels through an optical fiber (not shown) which is part of a communication system and configured to carry communication signals to the system of FIG. 1. The output of the photo-diode 104 connects to the amplifier A 112 as shown. The feedback resistor R 108 provides attenuated feedback to enable desired operation. The amplifier A 112 accurately amplifies the weak current signal from the photodiode 104 preferably without introducing unwanted noise or distortion.

The output of the TIA 114 connects to a single-ended to differential conversion unit 120 which converts the single ended output from the TIA 114 to a differential signal as shown. The differential output feeds into an output buffer 124. The output buffer 124 buffers the received data before forwarding it via the differential output 130 for further processing.

Although shown and described herein in relation to a TIA amplifier, it is contemplated that the innovation may be applied to amplifier environments other than a TIA. For example, any multistage amplifier may benefit by reducing the number of voltage conversions while still providing negative feedback to the input. In one embodiment, any multistage amplifier system having an odd number of stages, which is traditionally required for negative feedback, may benefit by having a reduced number of voltage conversions.

For the TIA 114, there has always been a desire for increased sensitivity. Increased sensitivity allows data systems to receive and accurately process and decode weaker received signals. As a result, transmit power can be reduced, thereby extending transmitter life and reducing power consumption. In addition, increased sensitivity can provide the necessary performance in the presence of additional loss, which means transmission distance can be extended for a given transmit power level and data transmit rate.

As discussed above, prior art TIAs were traditionally single stage or three stage inverter designs, where each inverter effectively acts like a voltage to voltage amplifier. These type of designs delivered negative feedback to the TIA input. The drawback to a single stage TIA is lack of amplification. While a three stage design can be made to meet gain specification, the drawback to a three stage TIA is that cumulative delay and distortion in each stage of the three stage TIA leads to unwanted distortion in the output. In particular, three stage TIA designs introduce an unacceptable amount of phase shift and distortion. This, combined with a lack of phase margin, leads to system instability and an increase in the bit error rate, both of which are unacceptable in optical communication systems.

In general, for desired operation, a TIA requires negative feedback to achieve desired operation. Prior to the present invention, two stage TIA designs were not possible because each stage created an inversion, and thus, two stages would yield positive feedback. Stated another way, a two stage design would yield positive feedback, which is commonly understood to lead to system instability.

To overcome the drawbacks in the prior art associated with TIA design and operation, a TIA comprised of two voltage to voltage stages is disclosed. FIG. 2A illustrates a block diagram of an example embodiment of a two stage TIA. This is but one possible two stage TIA design and as such, it is contemplated that other embodiments may be arrived at which do not depart from the claims that follow. In FIG. 2A, an input current signal $I_{in}$ is present at an input node 204. The input node 204 connects to a feedback path and a voltage to voltage (VtoV) amplifier 208. This input current flows through the input impedance of the TIA to create a voltage signal at the input, $V_i$.

The VtoV amplifier 208 amplifies the input voltage $V_i$ to an amplified version thereof. This amplified signal is inverted and is much like a VtoV amplifier stage used in a single stage or a three stage amplifier.

The output of the VtoV amplifier 208 connects to a second VtoV amplifier 220. The VtoV amplifier 220 again amplifies the received signal and provides an output voltage $V_2$ at an output node 224. The output node 224 presents the signal for subsequent processing, such as shown in FIG. 1, or to other apparatus if operating in other environments of use. In addition, the output signal at node 224 is provided to the feedback resistor $R_f$ 212. The resistor Rf 212 provides feedback to the input node 204 to provide negative feedback to the TIA input. As will be described, the second VtoV amplifier 220 does not invert the voltage polarity from input to output, which in combination with the inverted polarity from VtoV amplifier 208, results in negative feedback from output 224 to input 204 of the overall amplifier.

As can be appreciated, this two stage design simplifies enablement, reduces unwanted phase delay by minimizing voltage to voltage conversions (referred to herein as a voltage conversion), and provides amplification levels necessary for down stream processing.

Figure 2B:
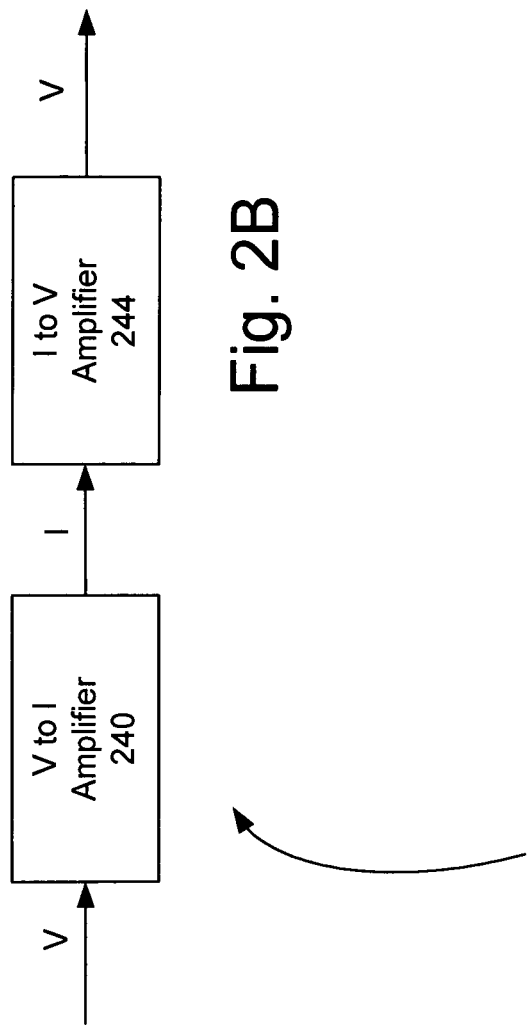
FIGS. 2A and 2B are block diagrams of a two stage amplifier.
Figure 2A:
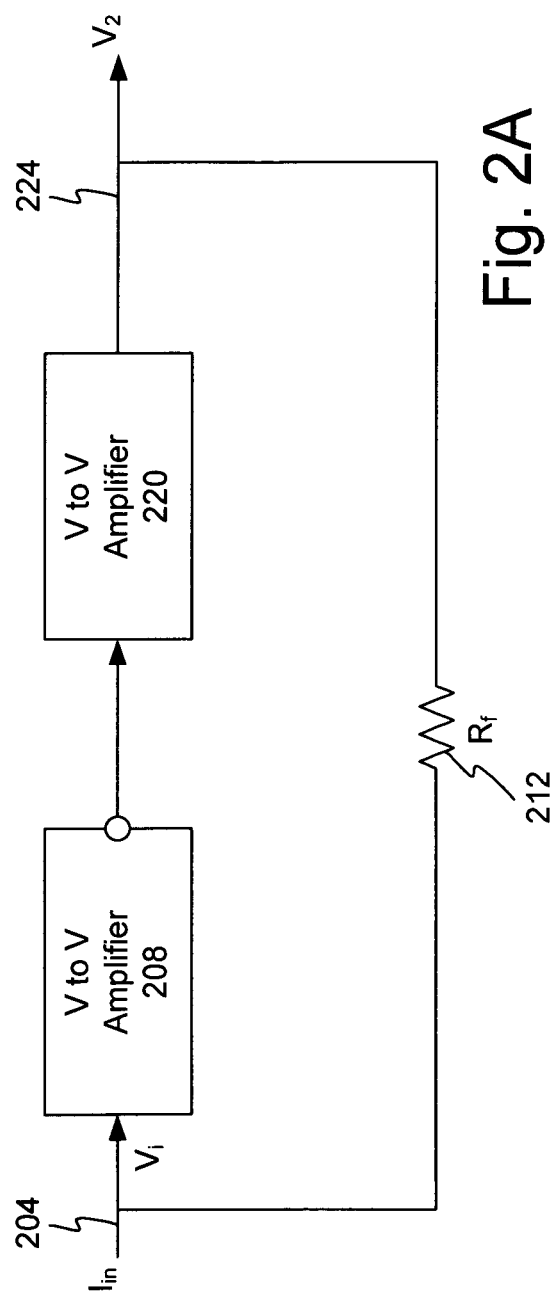

FIG. 2B illustrates a block diagram of an example embodiment of the VtoV amplifier 220. This is but one possible design for the VtoV amplifier 220 and as such, it is contemplated that other embodiments may be arrived at by one of ordinary skill in the art. The amplifier 220 may be represented as a voltage to current amplifier 240 which amplifies a received voltage V and outputs a current signal I. The current is input to a current to voltage amplifier 244, which amplifies the received current to create an output voltage. In this embodiment, the amplifier 240 comprises a transconductance amplifier and the amplifier 244 comprises a transimpedance amplifier. Therefore, the resulting amplifier effectively has two voltage to voltage amplifiers, even though the second voltage to voltage amplifier is comprised of a voltage to current amplifier and a current to voltage amplifier. Therefore, the amplifier can be considered as two voltage to voltage amplifiers while having the necessary signal inversion to provide negative feedback and stability.

Figure 3:
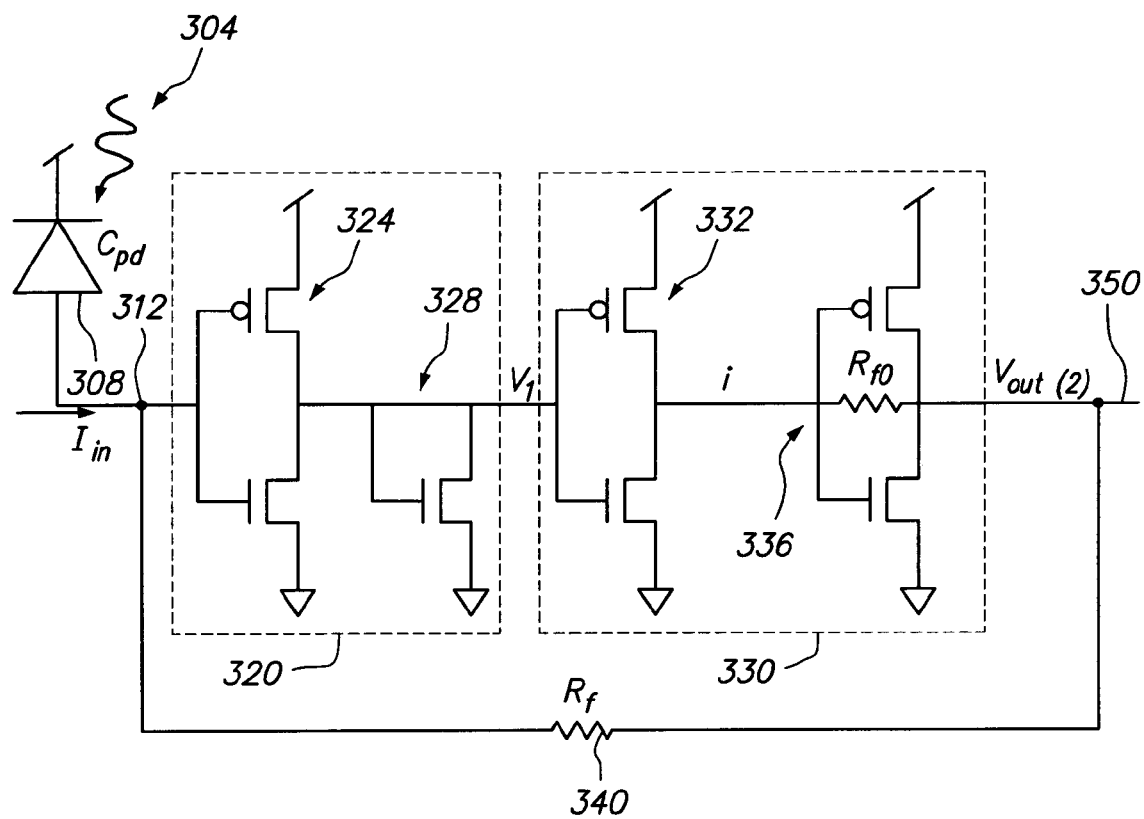
FIG. 3 illustrates an example circuit diagram of a two stage amplifier.

FIG. 3 illustrates an example circuit level embodiment of a two stage transimpedance amplifier. This is but one possible circuit level implementation and as such, it is contemplated that one of ordinary skill in the art may arrive at other circuit implementations. In this example embodiment, an optical signal 304 is presented to a photodiode 308. The photodiode 308 converts the light energy to an electrical current signal $I_{in}$, which is in turn provided to an input node 312. The input node 312 receives the input signal $I_{in}$ and a feedback signal from a feedback path, which includes a feedback resistor 340. The input signal $I_{in}$ creates a voltage $V_i$ by flowing through the input impedance of the TIA. This voltage $V_i$ is sent to a first amplifier stage 320 as shown. The first amplifier stage 320 includes an amplifier 324 and a load 328. The devices may comprise P-type and N-type MOSFETs as shown in any combination. It is also contemplated that other technology devices may be utilized including, but not limited to bipolar transistors, JFETs and MESFETs.

The load 328 comprises a semiconductor device as shown. In other embodiments, the load 328 may comprise a resistor to a reference voltage or an amplifier stage. The load converts the current output from the amplifier 324 to a voltage. This voltage $V_1$ is presented to a second stage 330. The signal $V_1$ is inverted as compared to the input signal $I_{in}$.

The second stage 330 comprises a transconductance amplifier 332, which amplifies the received signal $V_1$ to generate a current i as an output. The second stage 332 connects to a voltage conversion device 336 to convert the current signal i to a voltage $V_{out}$. The voltage conversion device 336 includes a resistor $R_{f0}$, which is discussed below in more detail. The amount of gain in the second stage 330 is based on the resistor value $R_{f0}$. Both devices 332 and 336 of the second stage 330 serve as a single stage because it performs a voltage to voltage amplification and thus, from a phase delay contribution, it appears as a single stage. The device 336 is a voltage creating resistance. Stated another way, the output of device 336 is inverted, as compared to the input, in this innovative design thereby providing negative feedback, but only two phase delays occur in the overall amplifier, thereby minimizing unwanted phase distortion.

The output of the second stage 330 is provided as a voltage signal $V_{out}$ to an output node 350. It is contemplated that the order of the first stage 320 and the second stage 330 may be reversed. The output signal $V_{out}$ may be provided to a gain stage or any other down stream processing. The output node 350 also connects to the feedback path and in particular to resistor $R_f$ 340. The feedback path provides negative feedback to the first stage as is preferred for desired amplifier operation. As an advantage to this configured over prior art designs, phase delay is reduced because only two stages are present, namely two voltage conversions occur. Voltage to voltage conversions introduce phase shift and this two stage design eliminates a voltage to voltage conversion, as compared to prior art three stage TIA unit which has three voltage to voltage conversion units. As a result, phase shift is reduced. It is contemplated that the gain of the second stage 330 may be different or the same as the gain of the first stage 320. In this embodiment, it is contemplated that gain may be greater than in a three stage design because gain can be increased without the associated distortion resulting from the unwanted three phase shifts in three stage designs.

The following equations aid in understanding the behavior of the example embodiment of FIG. 3. In particular, the gm, defined as the transconductance of the first stage 320 and the second stage 330, define the open loop gain of the TIA in addition to $R_{f0}$. The value $R_{f0}$ is the value of the resistor in the device 336. In general, the gain of the transimpedance amplifier is defined by the following equation:

$$TZ \approx \frac{AR_f}{1+A}$$

where TZ is the transimpedance gain of the entire system of FIG. 3, from the input current to the output voltage. A is the open loop gain and $R_f$ is the value of the feedback resistor 340.

As can be seen, as the open loop gain value A becomes larger, the total gain TZ is closely related to $R_f$.

The variable A may be further defined by the following equations:

$$A \approx \frac{(g_{mp}+g_{mn})_1}{(g_{mL})}(g_{mp}+g_{mn})_2 R_{fo}$$

where the value $(g_{mp}+g_{mn})_1$ is the gain of the first stage device 324 and $g_{mL}$ is the gain of the load 328. The term $(gmp+gmn)_2$ is the gain of the second stage amplifier 330. The value $R_{fo}$ is the value of the resistor in the device 336. Device 336 performs the conversion to voltage and provides gain. The total value A may only be made so large in a single stage, so multiple stages are combined to obtain a level of amplification which is adequate for the signal input to subsequent stages. In addition, the bandwidth of the TIA amplifier is defined as:

$$f_{3db} \approx \frac{A}{2\pi R_f C_{pd}}$$

where $f_{3db}$ is the bandwidth of the TIA and $C_{pd}$ is the capacitance of the photodiode. It may be desirable to minimize the capacitance of the photodiode $C_{pd}$, which in turn will increase the bandwidth. In one embodiment, the bandwidth is between 800 MHz and 3.5 GHz and may be used in 1 to 4 gigabit applications. In other embodiments, this method and apparatus may find application in other bandwidth environments. As can be seen, the bandwidth is also inversely related to the value $R_f$. As a result, while increasing the value $R_f$ increases gain, it also reduces the bandwidth.

Noise, which is preferably minimized, is defined as follows:

$$I_{noise,rms} \approx \sqrt{\frac{4kT\Delta f}{R_f}}$$

where the term k is the Boltzmann constant, T is the temperature in Kelvin scale, and $\Delta f$ is the bandwidth. Again, it is apparent that the noise is related to the value of the feedback $R_f$. Hence, by increasing $R_f$, the noise is reduced, but the bandwidth is reduced by increasing $R_f$. If noise is increased, then sensitivity decreases. In general, thermal noise, including the term $R_f$, is the dominant factor. It is desired to have the TIA create as little noise as possible because the bit error rate is a function of the noise, and as such, increased noise levels are unacceptable. Stated another way, to minimize noise, the system may increase the feedback resistor $R_f$, but increasing $R_f$ causes the bandwidth to go down.

In a three stage application, the open loop gain A must be limited to limit phase delay created by each voltage inversion. But, with the two stage design as shown and described herein, phase distortion is reduced, and the open loop gain A may be increased without peaking. In fact, A may be increased to an operation level that is greater than the gain of a three stage TIA. This may occur because with fewer voltage conversions, for example only two instead of three, less distortion is introduced, primarily in the nature of phase distortion. As such, with less phase distortion, gain can be increased without increasing bit error rate.

It should also be noted that there is a degree of freedom to increase $R_{f0}$, which in turn increases gain, without increasing distortion. As such, by increasing $R_{f0}$ gain is increased without increasing distortion.

With higher internal gain A, the overall bandwidth increases as seen from the equations above, so one can increase the feedback resistor value to keep the same bandwidth while at the same time lower the noise contribution from the amplifier.

One benefit of this proposed design, over prior art configurations, is that a significantly higher sensitivity can be achieved. In addition, the prior art teaches the need for a negative feedback in an amplifier system, and as such, this prior art teaching teaches away a two stage amplifier system. Implementing a prior art amplifier in a two stage configuration will not operate due to the feedback issue. This design achieves a two stage design while maintaining negative feedback.

The following references further aid in understanding the disclosure and are incorporated by reference in their entirety herein.
1. Low power and noise tolerant 20 Gb/s CMOS TIA for short-distance optical interconnect, Paillet, F.; Karnik, T.; Mixed-Signal Design, 2003, Southwest Symposium on 23-25 Feb. 2003 Page(s):49-53.
2. A CMOS 18 THzOhm 240 Mb/s Transimpedance Amplifier and 155 Mb/s LED-Driver for Low Cost Optical Fiber Links, Mark Ingels et. al., IEEE Journal of Solid-state circuits, Vol. 29, No. 12, December 1994.
3. A CMOS inverter TIA modeling with VHDL-AMS, Karray, M.; Desgreys, P.; Charlot, J.-J.; System-on-Chip for Real-Time Applications, 2003. Proceedings, The 3rd IEEE International Workshop on, 30 Jun.-2 Jul. 2003 Page(s): 172-174.

Also disclosed is herein is a multistage amplifier comprising an input node configured to present an input signal and N number of amplifier stages which are sequentially connected. These stages comprise a first stage and a last stage such that the first stage has an input connected to the input node to receive the input signal and the last stage has a last stage output which presents an amplified inverted signal, in comparison to the input signal. In this embodiment N is any odd number greater than or equal to three and N-1 voltage conversions occur. N-2 phase inversion(s) occur in the N number of amplifier stages. Also part of this embodiment is an output node that is connected to the last stage output and is configured to receive the amplified inverted signal. A feedback path connects the input node to the output node. In one embodiment, the feedback path comprises a feedback resistor.

In one configuration at least one of amplifier stage comprises a load or a resistance. In one configuration, the feedback path is configured to provide negative input to the input node and an even number of voltage inversions occur.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An optical signal receiver comprising:
an optical signal detector configured to detect an optical signal and output a corresponding electrical signal;
a transimpedance amplifier having only two amplifier stages which combined provide only one phase inversion, the transimpedance amplifier configured to receive and amplify the electrical signal to a level suitable for downstream processing, the transimpedance amplifier comprising:
a first stage comprising one amplifier and a load, the first stage configured to receive a first stage input current and generate a first stage output voltage;
a second stage forming a second stage output voltage such that the first stage input signal and the second stage output voltage have opposite voltage polarity and the second stage is a single stage based on phase delay contribution because it performs a voltage to voltage amplification, the second stage comprising:
one amplifier configured to receive and amplify the first stage output voltage and generate a second stage amplifier output current;
a voltage conversion device configured to receive and convert the second stage amplifier output current to the second stage output voltage, the second stage output voltage inverted in relation to the second stage amplifier output current;
a feedback path including a feedback resistor, the feedback path connecting an output of the second stage to an input of the first stage to provide negative feedback as a result of the opposite voltage polarity;
one or more receiver processing elements configured to process the amplified electrical signal received from the transimpedance amplifier.

2. The receiver of claim 1, further comprising a single ended to differential signal conversion unit configured to receive the output of the second stage and convert the output to a differential signal.

3. The receiver of claim 1, wherein the load comprises a FET.

4. The receiver of claim 1, wherein the first stage comprises a voltage to voltage amplifier and the second stage comprises a voltage to voltage amplifier.

5. The receiver of claim 1, wherein the second stage includes a semiconductor device.

6. The receiver of claim 1, wherein the first stage and the second stage collectively perform two voltage conversions, which introduces less phase shift as compared to a three stage transimpedance amplifier performing three voltage conversions.

7. An optical signal receiver comprising:
an optical signal detector configured to detect an optical signal and output a corresponding electrical signal;
a transimpedance amplifier having only two amplifier stages which combined provide only two phase delays, the transimpedance amplifier configured to receive and amplify the electrical signal to a level suitable for downstream processing, the transimpedance amplifier comprising:
a first stage forming a first stage output voltage such that a first stage input voltage and the first stage output voltage have opposite voltage polarity and the first stage is a single stage because it performs a voltage to voltage amplification thereby acting as a single stage based on phase delay contribution, the first stage comprising:
one amplifier configured to receive and amplify the first stage input voltage and generate a first stage amplifier output current;
a voltage conversion device configured to receive and convert the first stage amplifier output current to the first stage output voltage, the first stage output voltage inverted in relation to the first stage amplifier output current;

a second stage comprising one amplifier and a load, the second stage configured to receive the first stage output voltage and generate a second stage output voltage;

a feedback path including a feedback resistor, the feedback path connecting an output of the second stage to an input of the first stage to provide negative feedback as a result of the opposite voltage polarity between the first stage output voltage and a second stage output voltage; and one or more receiver processing elements configured to process the amplified electrical signal received from the transimpedance amplifier.

8. The receiver of claim 7, further comprising a single ended to differential signal conversion unit configured to receive the second stage output voltage of the second stage and convert the second stage output voltage to a differential signal.

9. The receiver of claim 7, wherein the load comprises a FET.

10. The receiver of claim 7, wherein the first stage comprises a voltage to voltage amplifier and the second stage comprises a voltage to voltage amplifier.

11. The receiver of claim 7, wherein the second stage further includes a semiconductor device.

12. The receiver of claim 7, wherein the first stage and the second stage collectively perform two voltage conversions, which introduces less phase shift as compared to a three stage transimpedance amplifier performing three voltage conversions.

* * * * *